US007898312B2

(12) United States Patent
Aoyagi et al.

(10) Patent No.: US 7,898,312 B2
(45) Date of Patent: Mar. 1, 2011

(54) VARIABLE DELAY APPARATUS

(75) Inventors: Hideki Aoyagi, Miyagi (JP); Hitoshi Asano, Miyagi (JP); Kazuya Toki, Miyagi (JP); Michiaki Matsuo, San Jose, CA (US); Suguru Fujita, Tokyo (JP)

(73) Assignee: Panasonic Corporation, Osaka (JP)

( * ) Notice: Subject to any disclaimer, the term of this patent is extended or adjusted under 35 U.S.C. 154(b) by 97 days.

(21) Appl. No.: 12/376,024

(22) PCT Filed: Aug. 7, 2007

(86) PCT No.: PCT/JP2007/065442

§ 371 (c)(1),
(2), (4) Date: Feb. 2, 2009

(87) PCT Pub. No.: WO2008/018456

PCT Pub. Date: Feb. 14, 2008

(65) Prior Publication Data

US 2009/0315605 A1    Dec. 24, 2009

(30) Foreign Application Priority Data

Aug. 10, 2006  (JP) .......................... P2006-217909
Jun. 21, 2007  (JP) .......................... P2007-163978

(51) Int. Cl.
*H03H 11/26* (2006.01)
(52) U.S. Cl. ..................... 327/276; 327/277; 327/299
(58) Field of Classification Search ................. 327/276, 327/277, 284, 271, 99, 298, 299
See application file for complete search history.

(56) References Cited

U.S. PATENT DOCUMENTS 5,389,843 A * 2/1995 McKinney .................. 327/276
5,550,514 A * 8/1996 Liedberg .................... 331/1 A (Continued)

FOREIGN PATENT DOCUMENTS

JP    06-196958 A    7/1994

(Continued)

OTHER PUBLICATIONS

International Search Report for PCT/JP2007/065442.

*Primary Examiner*—An T Luu
(74) *Attorney, Agent, or Firm*—Pearne & Gordon LLP

(57) ABSTRACT

It is an object of the invention to provide a variable delay apparatus in which, even immediately after the delay amount of the variable delay apparatus is changed, a signal of a timing that is different from a set delay amount is not output. The variable delay apparatus of the invention includes: a variable delay block 108 having N (N is a natural number) delay elements 101a to 101n, and N selectors 102a to 102n; a variable delay block 109 having N delay elements 103a to 103n, and N selectors 104a to 104n; and a selector 107. After selection signals 105a to 105n and 106a to 106n are changed, and after an output timing of a delay amount set by the variable delay blocks 108, 109 is attained, the signal to be output is switched by the selector 107, thereby avoiding a situation where, immediately after the delay amount is changed, a signal of a timing that is different from the set delay amount is output as an output signal.

16 Claims, 13 Drawing Sheets

U.S. PATENT DOCUMENTS

| | | | |
|---|---|---|---|
| 5,646,564 A * | 7/1997 | Erickson et al. | 327/158 |
| 5,781,056 A * | 7/1998 | Fujii | 327/276 |
| 6,008,680 A | 12/1999 | Kyles et al. | |
| 6,486,716 B1 * | 11/2002 | Minami et al. | 327/152 |

FOREIGN PATENT DOCUMENTS

| | | |
|---|---|---|
| JP | 08-056143 A | 2/1996 |
| JP | 09-093082 A | 4/1997 |
| JP | 11-168376 A | 6/1999 |

* cited by examiner

FIG.5

| Signal | Values |
|---|---|
| 3-BIT DELAY SELECTION SIGNAL 301 | DELAY AMOUNT: 2 \| DELAY AMOUNT: 4 \| DELAY AMOUNT: 3 |
| INPUT SIGNAL 111 | A B C D E F G H I J K L M N O P Q R S T |
| 3-BIT DELAY SELECTION SIGNAL 105 | DELAY AMOUNT: 2 \| DELAY AMOUNT: 4 |
| OUTPUT OF VARIABLE DELAY BLOCK 108 | Y Z A B C D E F G H I J K L M N O P |
|  | OUTPUT OF DELAY AMOUNT OF 2 \| OUTPUT OF DELAY AMOUNT OF 4 |
| 3-BIT DELAY SELECTION SIGNAL 106 | DELAY AMOUNT: 5 \| DELAY AMOUNT: 3 |
| OUTPUT OF VARIABLE DELAY BLOCK 109 | V W X Y Z A B C D E F G H I J K L M N O P |
|  | OUTPUT OF DELAY AMOUNT OF 5 \| DELAY AMOUNT WHICH IS DIFFERENT FROM SET VALUE \| OUTPUT OF DELAY AMOUNT OF 3 |
| OUTPUT SELECTION SIGNAL 110 | |
| OUTPUT SIGNAL 112 | W X Y Z A B C D E F G H I J K L M N O P Q |
|  | OUTPUT OF DELAY AMOUNT OF 2 \| OUTPUT OF DELAY AMOUNT OF 4 \| OUTPUT OF DELAY AMOUNT OF 3 |

FIG.6

| 3-BIT DELAY SELECTION SIGNAL 105 | DELAY AMOUNT: 2 | | | | | | DELAY AMOUNT: 4 | | | |
|---|---|---|---|---|---|---|---|---|---|---|
| INPUT SIGNAL 111 | A | B | C | D | E | F | G | H | I | J | K | L | M |
| OUTPUT OF DELAY ELEMENT 101n | W | X | Y | Z | A | B | C | D | E | F | G | H | I |
| INPUT OF DELAY ELEMENT 101b | A | B | C | D | E | F | G | D | E | F | G | H | I |
| OUTPUT OF DELAY ELEMENT 101b | Y | Z | A | B | C | D | E | F | G | D | E | F | G |
| INPUT OF DELAY ELEMENT 101a | Y | Z | A | B | C | D | E | D | E | F | G | H | I |
| OUTPUT OF DELAY ELEMENT 101a | X | Y | Z | A | B | C | D | E | D | E | F | G | H |
| OUTPUT OF SELECTOR 102a | Y | Z | A | B | C | D | E | D | E | F | G | H | I |
| TIME DIFFERENCE BETWEEN INPUT AND OUTPUT | 2t | 2t | 2t | 2t | 2t | 2t | 2t | 4t | 4t | 4t | 4t | 4t | 4t |

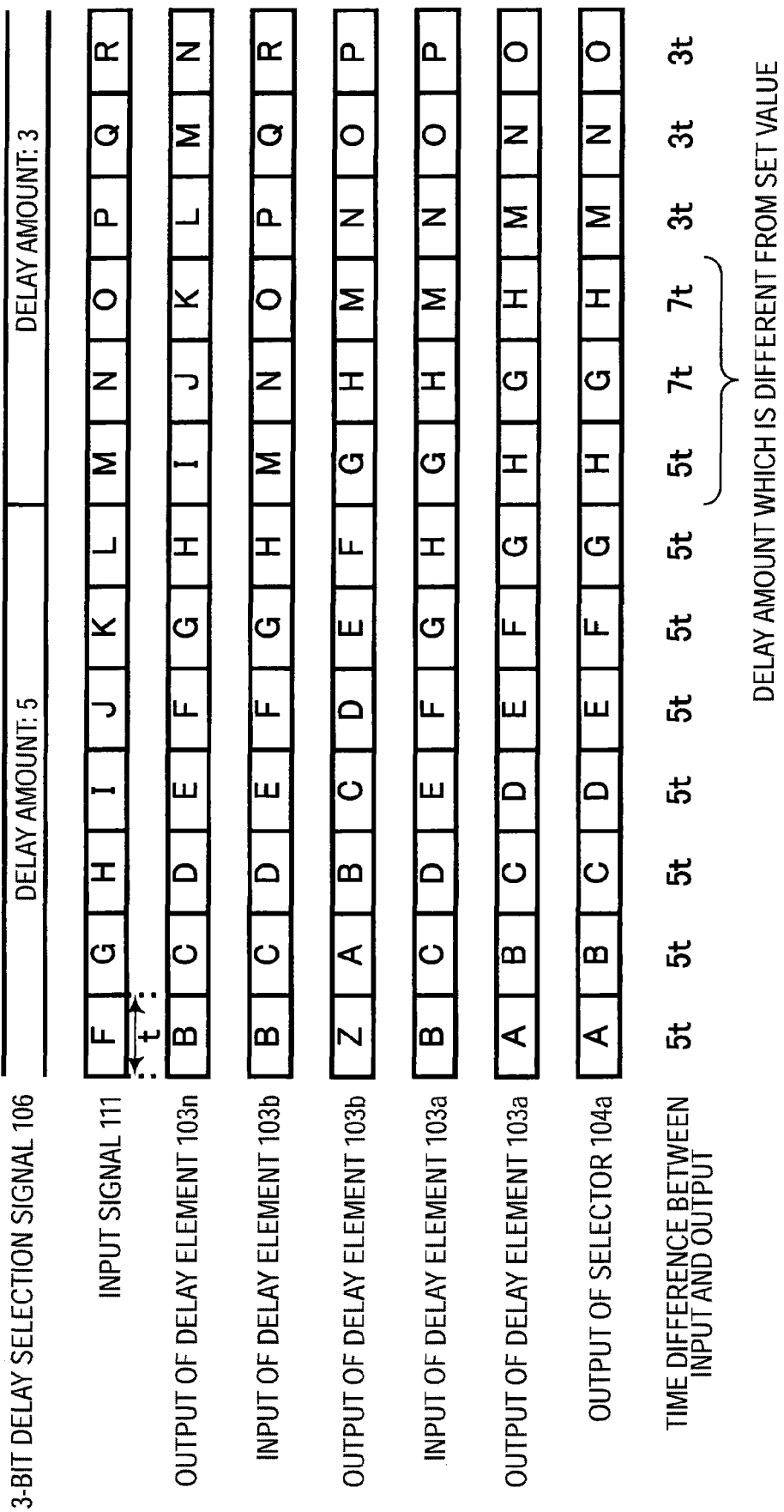

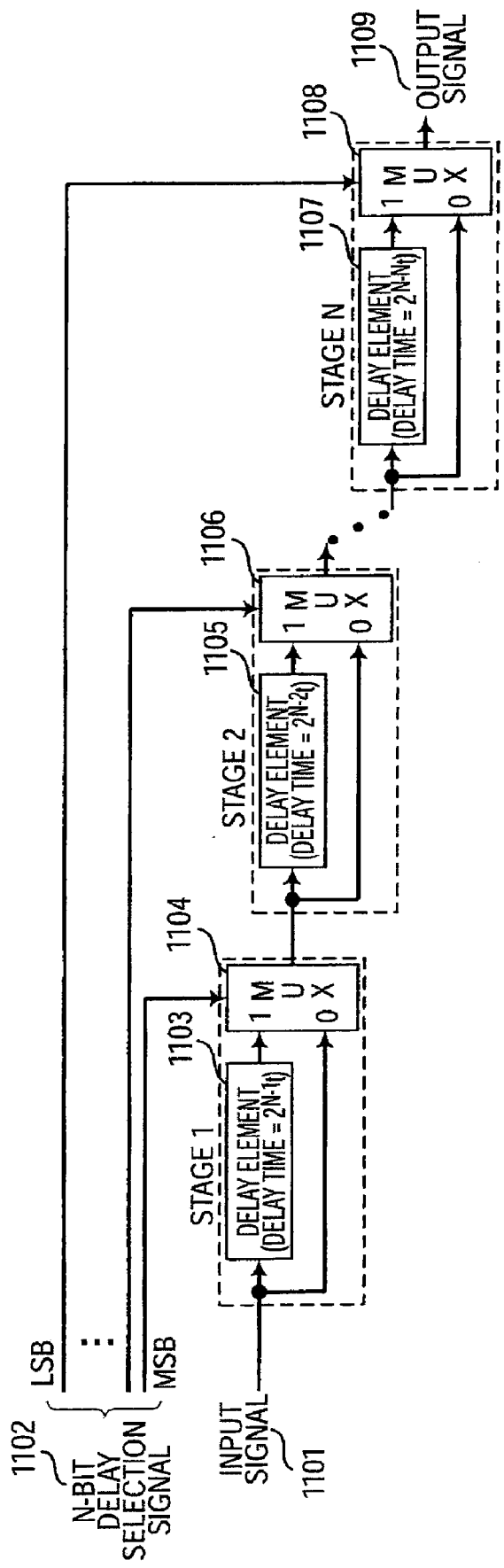

CIRCUIT CONFIGURATION

WAVEFORM

VARIABLE DELAY APPARATUS

TECHNICAL FIELD

The present invention relates to a variable delay apparatus in which the delay time is made variable to adjust the timing of an input signal and output the adjusted signal.

BACKGROUND ART

As a general variable delay apparatus, there is a variable delay apparatus in which a plurality of delay elements are connected in series and the outputs of the delay elements are selected (for example, see Patent Reference 1). In order to reduce the apparatus scale, furthermore, a variable delay apparatus is configured by combining delay elements having a delay amount of N-th power of 2×t (t is the shortest delay time, and N is an integer) (for example, see Patent Reference 2).

FIG. 10 shows the configuration of the general variable delay apparatus disclosed in Patent Reference 1. Delay elements 1002a to 1002n are connected in series, an input signal 1001 and the outputs of the delay elements 1002a to 1002n are connected to a selector 1004, and an output signal 1005 is selected by a selection signal 1003, thereby configuring a variable delay apparatus in which the delay amount of the input signal 1001 is variable.

FIG. 11 shows the configuration of the general variable delay apparatus disclosed in Patent Reference 2. An N number of delay stages respectively configured by delay elements 1103, 1105, 1106 having a delay amount of (N−n)-th power of 2×t (t is the shortest delay time, and n is an integer from 1 to N), and multiplexers 1104, 1106, 1108 are connected in series, and internal signal paths in the delay stages are selected by an N-bit delay selection signal 1102, thereby configuring a variable delay apparatus in which the delay amount of the input signal 1101 is variable.

Patent Reference 1: JP-A-8-56143
Patent Reference 2: JP-A-6-196958

DISCLOSURE OF THE INVENTION

Problems that the Invention is to Solve

In a variable delay apparatus having a configuration such as Patent Reference 1, however, delay elements the number of which is equal to that of variable times to be varied are necessary, and there is a problem in that, in the case where the range of the variable time is wide, or the resolution of the variable time is small, many delay elements are required and the scale of the apparatus is enlarged.

Moreover, a variable delay apparatus having a configuration such as Patent Reference 2 has a problem in that there is a case where, immediately after a change of the delay amount of the variable delay apparatus, a signal of a timing which is different from a set delay amount is output as an output signal. Hereinafter, the problem will be discussed in detail.

FIG. 12A is a block diagram of the case where N is 3 in a variable delay apparatus having a configuration such as Patent Reference 2, and FIG. 12B is a timing chart showing an example of an operation timing.

As shown in FIG. 12B, in the case where a 3-bit delay selection signal 1202 is changed from a set value of 4 to a set value of 3, during a time of 3t immediately after the delay amount of 3 is set, a signal of a timing in which the time difference between the input and output signals is other than 3t (a delay time which does not correspond to the delay time set value of 3), different from the delay time of 4t corresponding to the immediately preceding set value of 4t, and different from the set value is output.

The invention has been conducted in order to solve the above-discussed problems. It is an object of the invention to provide a variable delay apparatus in which, even immediately after the delay amount of the variable delay apparatus is changed, a signal of a timing that is different from a set delay amount is not output.

Means for Solving the Problems

The variable delay apparatus of the invention is a variable delay apparatus which delays an input signal by a delay amount corresponding to a delay selection signal, and which outputs the delayed signal. The apparatus includes: first to I-th variable delay blocks (I is a natural number) which delay the input signal by first to I-th delay amounts that are respectively set by the delay selection signal, and which output the delayed signal; and a first selector which switches and outputs output signals of the first to I-th variable delay blocks correspondingly with an output selection signal that is produced in correspondence with the first to I-th delay amounts.

According to the configuration, the output signals of the first to I-th variable delay blocks are switched to be output correspondingly with the output selection signal that is produced in correspondence with the first to I-th delay amounts. Even immediately after the delay amount of the variable delay apparatus is changed, therefore, it is possible to avoid a situation where a signal of a timing that is different from the set delay amount is output.

Effects of the Invention

According to the variable delay apparatus of the invention, it is possible to provide a variable delay apparatus in which, even immediately after the delay amount of the variable delay apparatus is changed, a signal of a timing that is different from a set delay amount is not output.

BRIEF DESCRIPTION OF THE DRAWINGS

FIG. 5 is a timing chart (1) showing an operation example in the case where N is 3 in Embodiment 2 of the invention.

FIG. 6 is a timing chart (2) showing an operation example in the case where N is 3 in Embodiment 2 of the invention.

FIG. 7 is a timing chart (3) showing an operation example in the case where N is 3 in Embodiment 2 of the invention.

FIG. 11 is a diagram showing the configuration of a general variable delay apparatus disclosed in Patent Reference 2.

Figure 1:
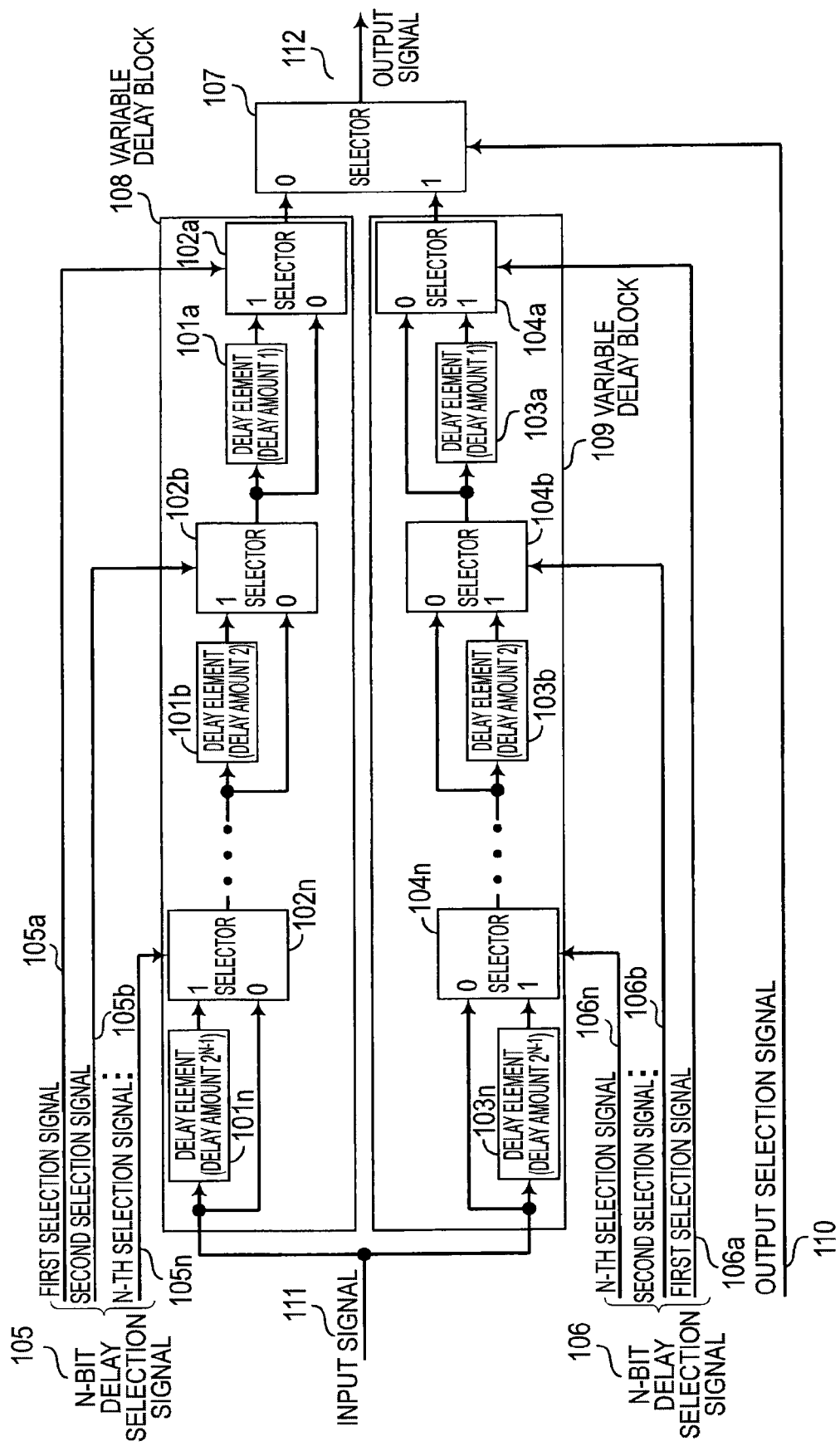
FIG. 1 is a block diagram of a variable delay apparatus of Embodiment 1 of the invention.

DESCRIPTION OF REFERENCE NUMERALS AND SIGNS 101a-n, 103a-n, 901a-f, 1103, 1105, 1107, 1203, 1205, 1207 delay element
102a-n, 104a-n, 902a-f, 905, 1004 selector
105, 106, 301, 908, 1102 N-bit delay selection signal
108, 108, 904a-c variable delay block
110 output selection signal
111, 907, 1001, 1101, 1201 input signal
112, 910, 1005, 1109, 1209 output signal
302 selection signal controller
903a to f, 1003 selection signal
906 selection signal controller
909 block selection signal
1002a-n gate (delay element)
1104, 1106, 1108, 1204, 1206, 1208 multiplexer
1203 3-bit delay selection signal

BEST MODE FOR CARRYING OUT THE INVENTION

Hereinafter, embodiments of the invention will be described with reference to the drawings.

Embodiment 1

In Embodiment 1 of the invention, a variable delay apparatus in which variable delay blocks are parallelized, and one of outputs is employed as a delay output will be described. In the embodiment, basically, the employment is alternately performed. Switching of employed one of outputs of the variable delay blocks (switching of the variable delay blocks) is performed after elapse of, from a change of setting of the delay amount, a predetermined time when the changed delay time is reflected.

FIG. 1 is a block diagram of the variable delay apparatus of Embodiment 1 of the invention. The variable delay apparatus shown in FIG. 1 delays an input signal by a delay amount corresponding to a delay selection signal, and outputs the delayed signal. The apparatus includes: a variable delay block 108 which delays an input signal 111 by a first delay amount that is set by an N-bit delay selection signal 105, and outputs the delayed signal; a variable delay block 109 which delays the input signal 111 by a second delay amount that is set by an N-bit delay selection signal 106, and outputs the delayed signal; and a selector 107 which switches output signals of the variable delay block 108 and the variable delay block 109 correspondingly with an output selection signal 110 that is produced in correspondence with the first and second delay amounts, and which outputs the output signal as an output signal 112. In FIG. 1, the input signal 111 is input into a delay element 101n of the variable delay block 108, 103n of the variable delay block 109, a selector 102n of the variable delay block 108, and a selector 104n of the variable delay block 109.

In the case where an N-th selection signal 105n is "1", the selector 102n selects a signal output from the delay element 101n, as the output, and, in the case of "0", selects the input signal 111 as the output. In the case where a second selection signal 105b is "1", the selector 102b selects a signal output from the delay element 101b, as the output, and, in the case of "0", selects a signal input to the delay element 101b, as the output.

In the case where a first selection signal 105a is "1", the selector 102a selects a signal output from the delay element 101a, as the output, and, in the case of "0", selects a signal input to the delay element 101a, as the output. In the case where an N-th selection signal 106n is "1", the selector 104n selects a signal output from the delay element 103n, as the output, and, in the case of "0", selects the input signal 111 as the output.

In the case where a second selection signal 106b is "1", the selector 104b selects a signal output from the delay element 103b, as the output, and, in the case of "0", selects a signal input to the delay element 103b, as the output. In the case where a first selection signal 106a is "1", the selector 104a selects a signal output from the delay element 103a, as the output, and, in the case of "0", selects a signal input to the delay element 103a, as the output.

In the case where the output selection signal 110 is "0", the selector 107 selects the signal output from the variable delay block 108, as the output signal 112, and, in the case of "1", selects the signal output from the variable delay block 109, as the output signal 112.

In the variable delay apparatus of the embodiment, in the case where the delay amount of the input signal 111 is changed from the delay amount of 4 to the delay amount of 3, for example, the variable delay block 108 is set to the delay amount of 4, the variable delay block 109 is set to the delay amount of 3, and then the selector 107 is switched from 0 to 1.

Figure 2:
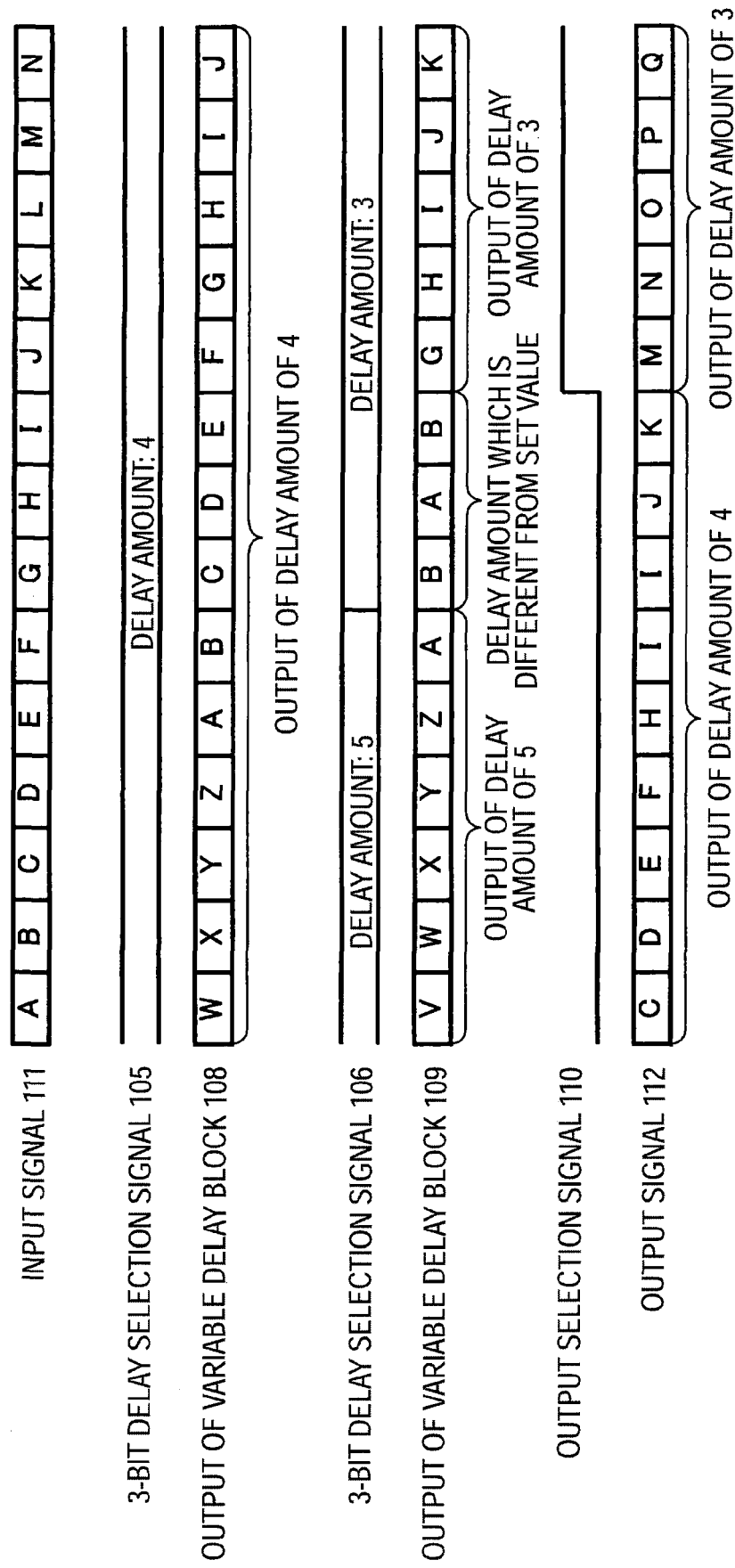
FIG. 2 is a timing chart showing an operation example in the case where N is 3 in Embodiment 1 of the invention.
Figure 12A:
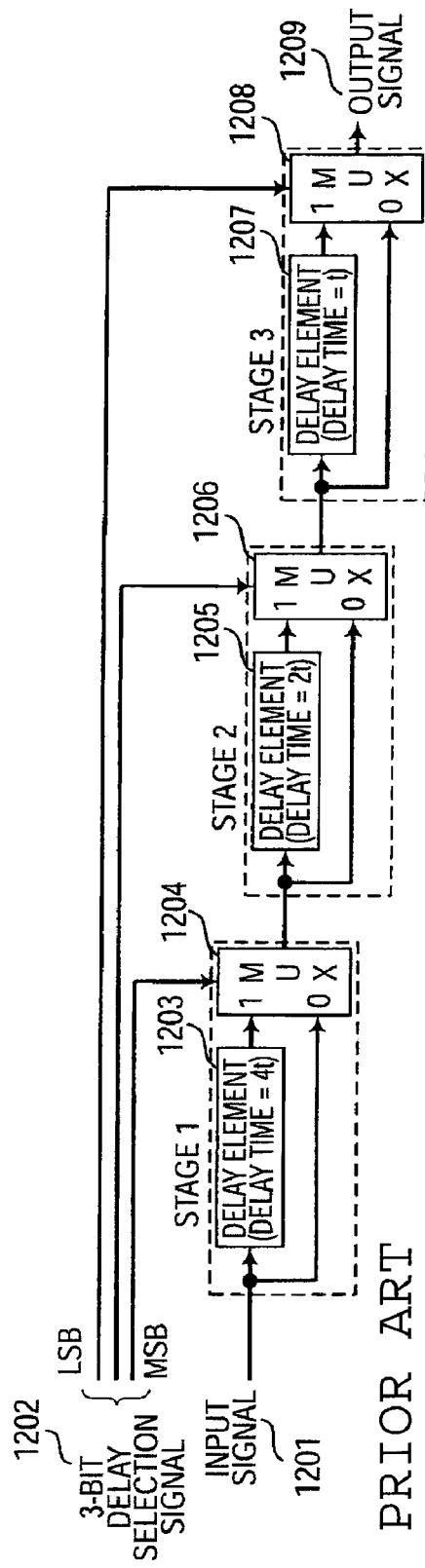
FIG. 12A is a block diagram of the case where N is 3 in the variable delay apparatus disclosed in Patent Reference 2, and FIG. 12 B is a chart showing an example of an operation timing.
Figure 12B:
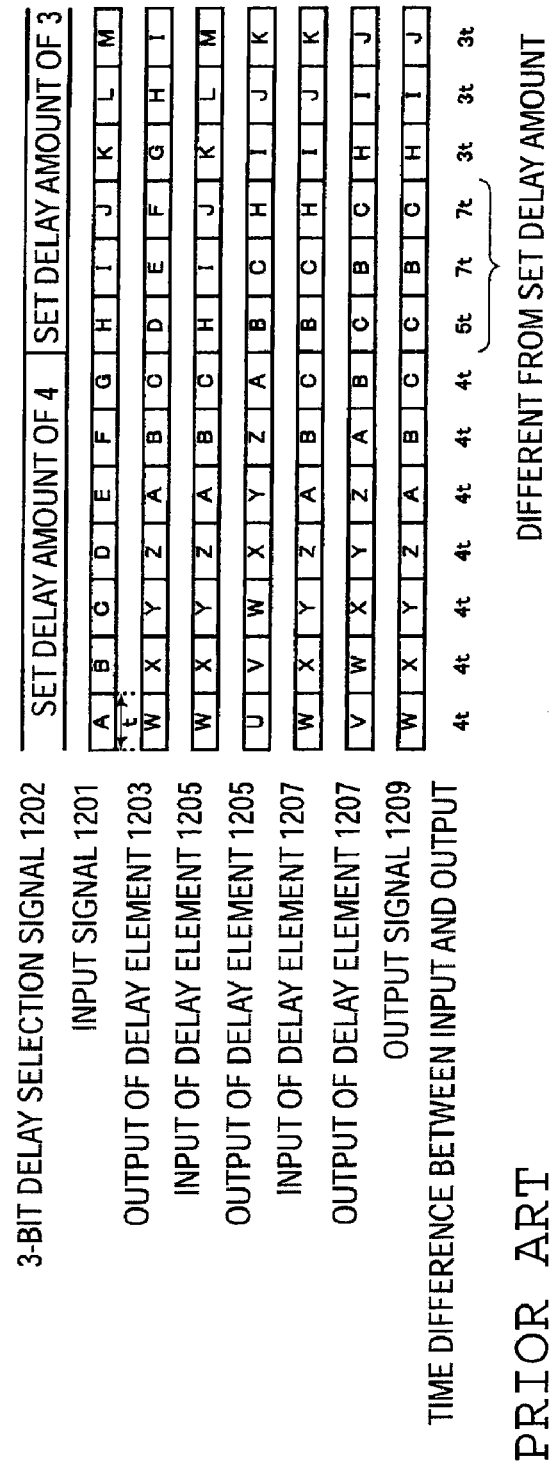

FIG. 2 is a timing chart showing an operation example in the case where N is 3 in Embodiment 1 of the invention. In the case where a state where the delay amount of 4 (the first selection signal 105a is "0", the second selection signal 105b is "0", and the third selection signal 105n is "1") is set as the 3-bit delay selection signal 105 in the variable delay block 108 is changed to the delay amount of 3, there is a case where a signal of a timing which is different from the delay amount of 3 set as shown in FIG. 12B is output as the output signal.

Therefore, the delay amount of 3 (the first selection signal 106a is "1", the second selection signal 106b is "1", and the third selection signal 106n is "0") is set as the 3-bit delay selection signal 106 in the variable delay block 109, the output selection signal 110 is changed after elapse of the time when a signal of a timing which is different from the set delay amount is output as the output signal, or longer, and the signal which is to be output from the selector 107 as the output signal 112 is changed from the output of the variable delay block 108 to that of the variable delay block 109.

As shown in FIG. 2, namely, when the 3-bit delay selection signal 106 is changed from the delay amount of 5 to the delay amount of 3, the delay amount which is different from the set value (in this case, the delay amount of 3) is output from the variable delay block 109. In the embodiment, therefore, the selector 107 is switched by the output selection signal 110 after elapse of a time longer than that when a signal of a timing which is different from the set delay amount is output, and the output signal 112 is switched from the delay amount of 4 to the delay amount of 3.

As a result, a signal of a timing that is different from a set delay amount is not output. Although the case where N is 3 has been described in the above, this is simply an example, and the invention is not restricted to the case where N is 3.

In the above description, the case where the switching of the plural variable delay blocks is performed after elapse of a predetermined time from a change of the setting of the delay amount has been described. Alternatively, the switching may be performed after the set value and the output value are compared with each other and the result is checked to be within a predetermined error range. The function of checking that the result is within the predetermined error range may be realized, for example, by using a phase comparator.

In the above description, the case where, as a countermeasure against the case where the set value and the output value are different from each other, the plural variable delay blocks are switched after elapse of a predetermined time, i.e., the switching waits for elapse of the predetermined time has been described. Alternatively, when the difference between the set value and the output value is within the predetermined error range, the output value of the variable delay block may be adjusted so as to coincide with the set value. For example, this adjustment can be realized by disposing a power supply controller which changes bias voltages to be applied to the delay elements of the variable delay block.

Figure 13A:
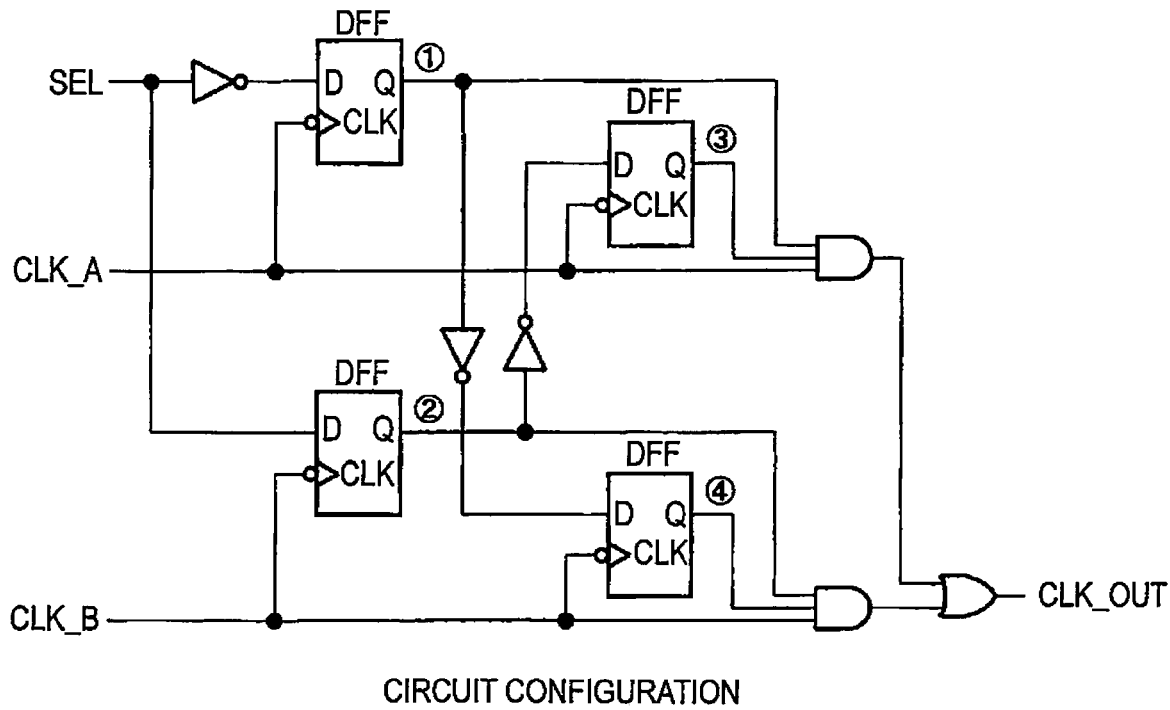
FIG. 13A is a view showing a circuit configuration of a selector.
Figure 13B:
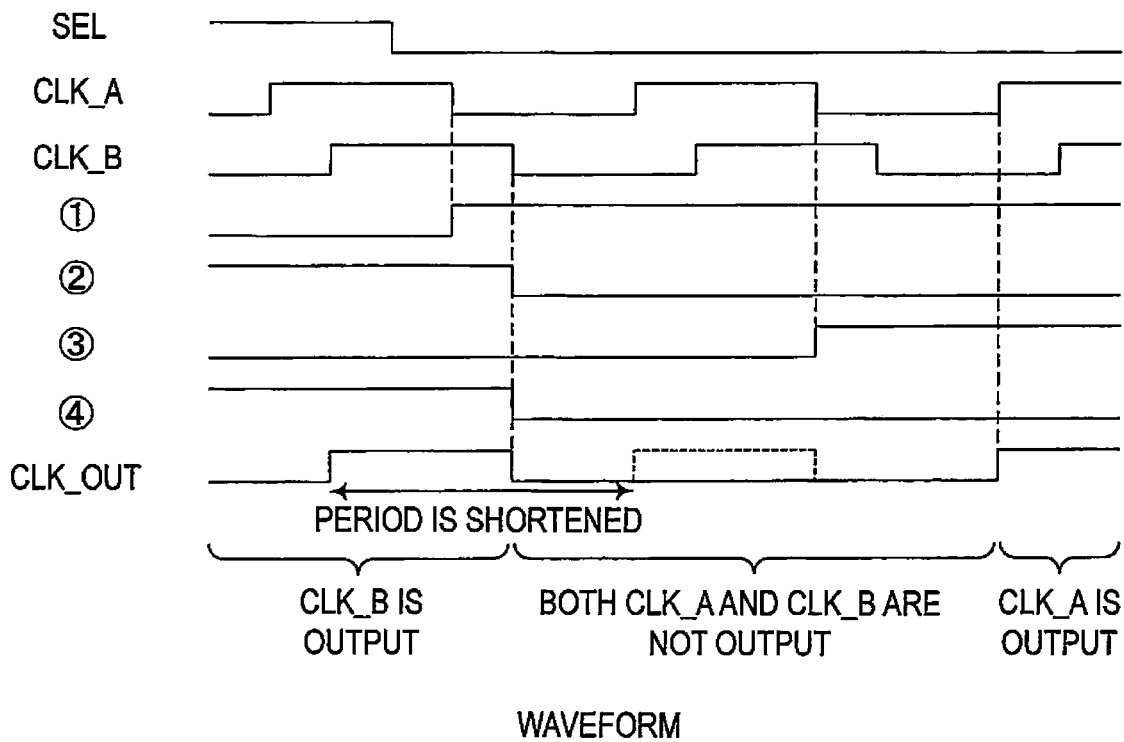
FIG. 13B is an example of an operation timing in Embodiment 1 of the invention.

FIG. 13A is a view showing a circuit configuration of the selector, and FIG. 13B is an example of an operation timing. In the case where the input signal is a clock (0 and 1 are periodically changed in an alternate manner) signal, the circuit of FIG. 13A is applied to the selector 107 of FIG. 1, and the selecting operation is performed in synchronization with the clock, whereby the delay amount can be changed without producing a glitch in the output clock. The selecting operation is performed so that the output clock always has a long period. When the setting of the delay amount is changed, therefore, the frequency does not exceed the maximum operating frequency of a circuit which uses the output clock, thereby enabling the circuit which uses the output clock, to always normally operate.

Embodiment 2

In Embodiment 2 of the invention, a variable delay apparatus which, in addition to the variable delay apparatus of Embodiment 1, further includes delayed-output selector, and which performs the switching of the plural variable delay blocks while referring to a correlation table of the set delay amount and to completion of the setting will be described.

Figure 3:
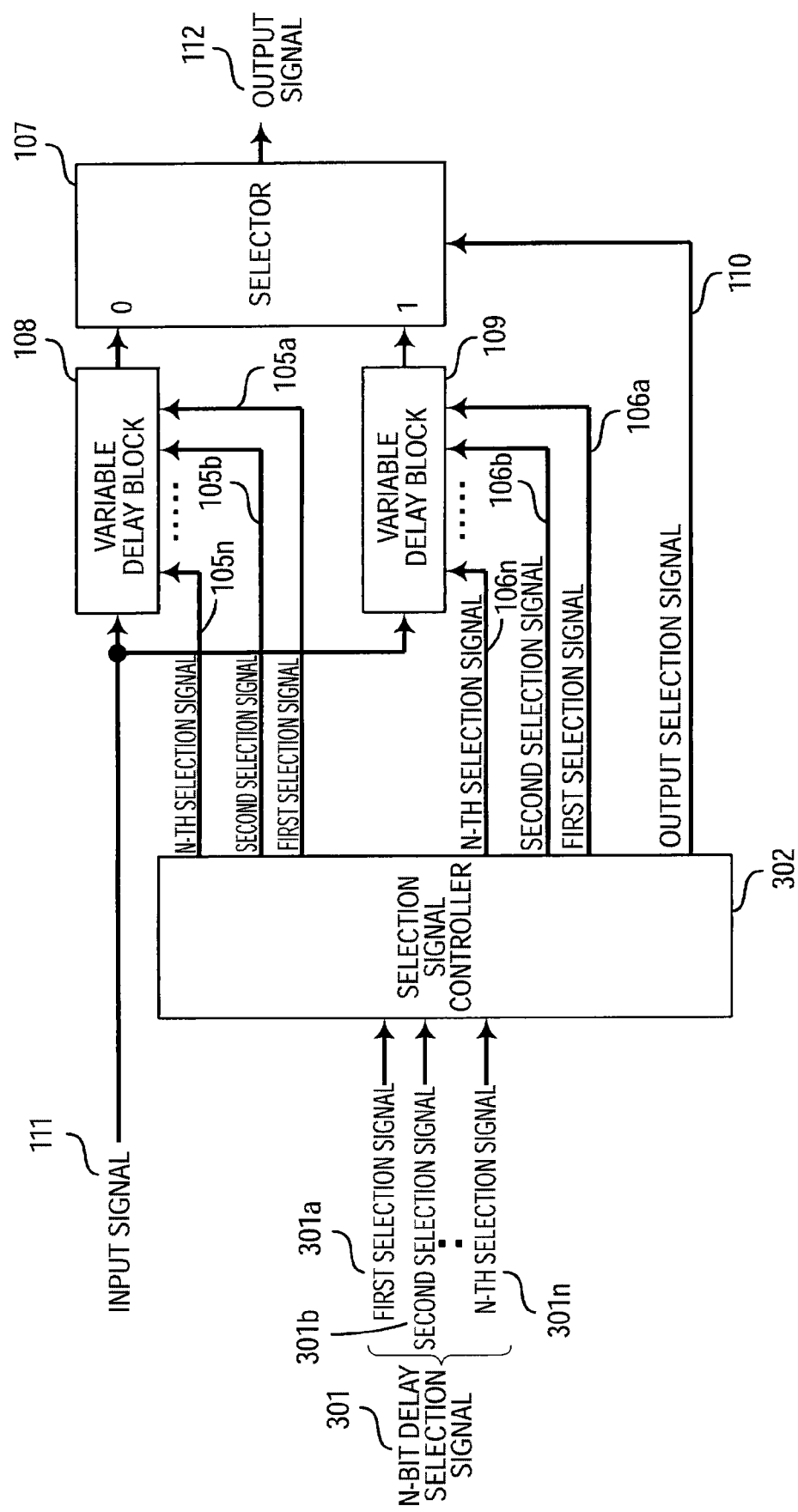
FIG. 3 is a block diagram of a variable delay apparatus of Embodiment 2 of the invention.

FIG. 3 is a block diagram of the variable delay apparatus of Embodiment 2 of the invention. In FIG. 3, the variable delay apparatus is different from that shown in FIG. 1 in that the apparatus includes a selection signal controller 302 which receives a supply of an N-bit delay selection signal 301 that is a signal for selecting the delay amount for the input signal 111, and which performs a control of outputting a selection signal for setting the delay amount to one or both of the variable delay blocks 108, 109. The selection signal controller 302 supplies the output selection signal 110 to the selector 107 to control the selector 107 so as to output one of the signals from the variable delay blocks 108, 109, as the output signal 112.

Figure 4:
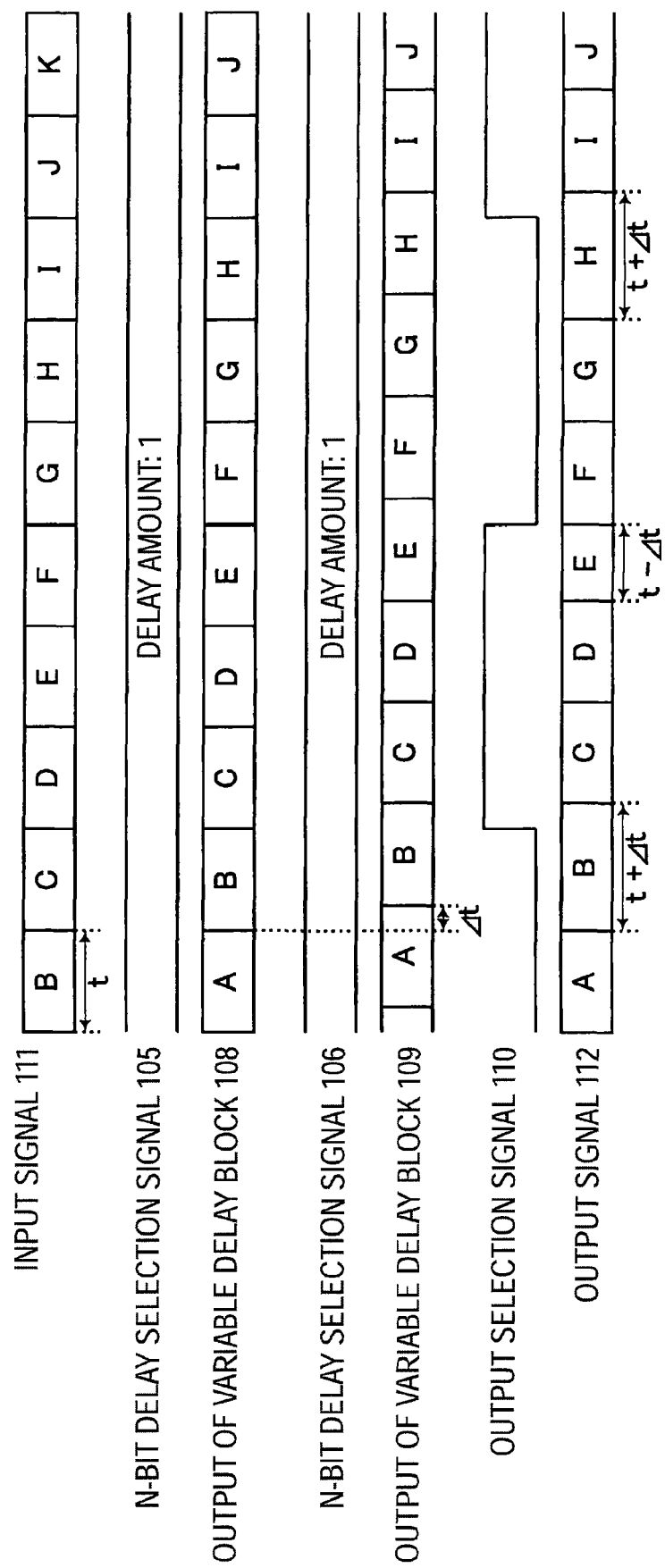
FIG. 4 is a timing chart showing that jitter of an output signal occurs in Embodiment 2 of the invention.

FIG. 4 is a timing chart showing that jitter of the output signal occurs in Embodiment 2 of the invention. Referring to FIG. 4, in the case where both the N-bit delay selection signals 105, 106 indicate the delay amount of 1, it is very difficult in an actual apparatus that the delay amount of the variable delay block 108 is made completely identical with that of the variable delay block 109. In this example, it is assumed that a difference of Δt exists.

When the output selection signal 110 is changed, the signal which is to be output as the output signal 112 is switched between the output from the variable delay block 108 and that from the variable delay block 109, so that, even when the change interval of the input signal 111 is t, the output signal 112 has three kinds of change intervals: t−Δt; t; and t+Δt, and jitter occurs in the output signal.

FIG. 5 is a timing chart showing an operation example in the case where N is 3 in Embodiment 2 of the invention. In the case where the 3-bit delay selection signal 301 is changed in the sequence of the delay amount of 2, the delay amount of 4, and the delay amount of 3, when the variable delay block 108 is set to the delay amount of 2 and then set to the delay amount of 4, the timing of FIG. 6 is obtained. In this case, the output signal from the variable delay block 108 does not have a timing which is different from the set delay amount. Therefore, the selection signal controller 302 performs the control so that also the setting of the delay amount of 4 is conducted on the variable delay block 108.

By contrast, in the case where the delay amount of 5 is set and then the delay amount of 3 is set, when the delay amount of the variable delay block 108 is changed, the timing of FIG. 7 is obtained, and a signal of a timing which is different from the set delay amount is output. Therefore, the selection signal controller 302 sets the delay amount of 3 in the variable delay block 109.

After the delay amount of 3 is set in the variable delay block 109, a signal which is different from the set value is output from the variable delay block 109. However, the signal output from the variable delay block 108 is caused by the selector 107 to be output as the output signal 112, and hence the output signal 112 is not affected by the output of the variable delay block 109.

After the signal which corresponds to the delay amount set in the 3-bit delay selection signal 106 is output as the output signal of the variable delay block 109, the selection signal controller 302 changes the output selection signal 110 which is supplied to the selector 107, and causes the output signal of the variable delay block 109 to be output as the output signal 112, whereby a situation where a signal which is different from the set delay amount is output can be avoided.

In the case where, when the set delay amount is changed in the same variable delay block, there is no possibility of outputting a signal which is different from the set value, the delay amount is changed in the variable delay block which is used at this time, and the signal switching by the selector 107 is not performed, whereby jitter in the output signal 112 can be reduced. Although the case where N is 3 has been described, this is an example, and the invention is not limited to the case where N is 3.

Figure 8:
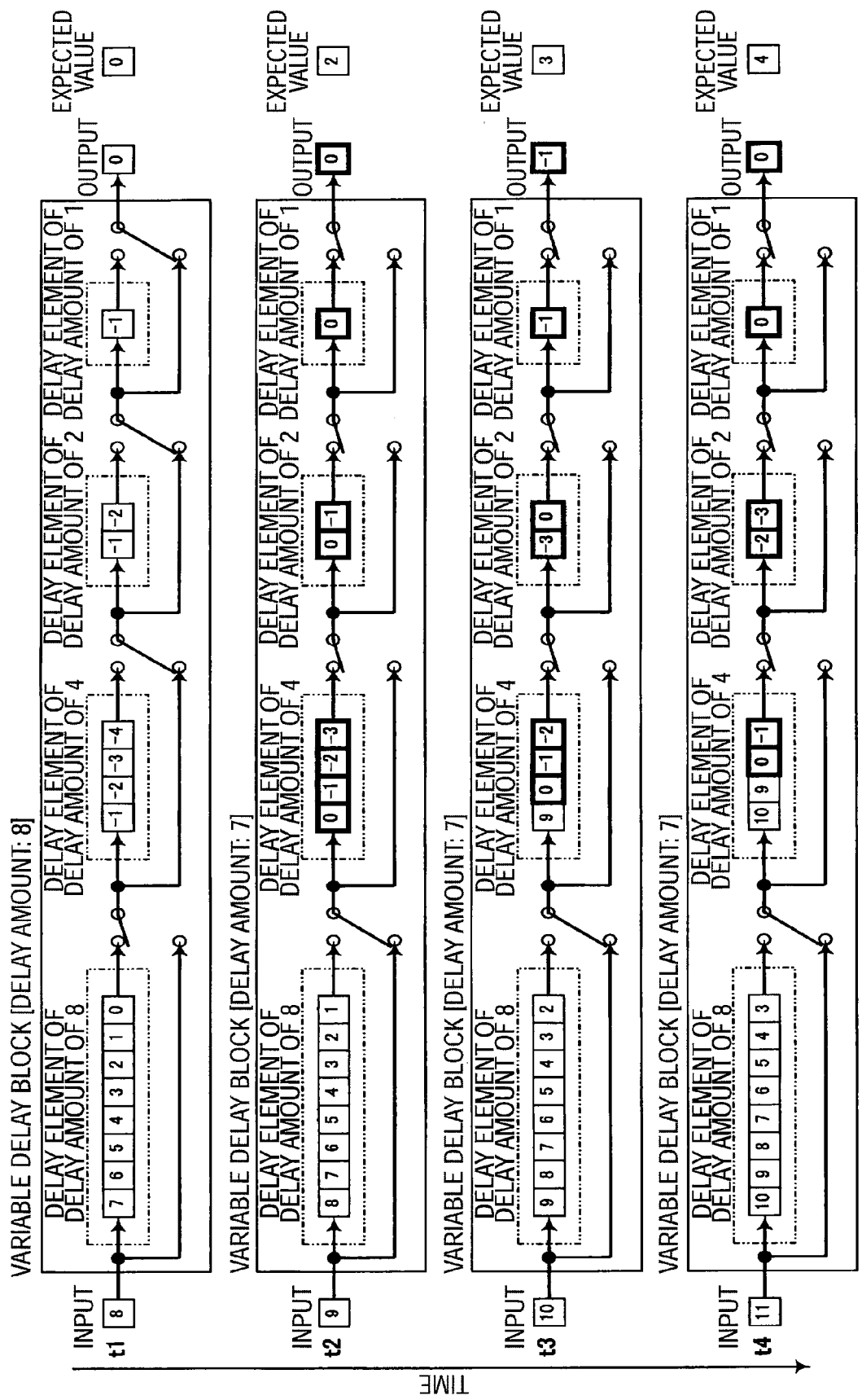
FIG. 8 is a diagram showing a state where, in the case where the setting of the delay time is changed from 8 to 7 in Embodiment 2 of the invention, a signal of a timing that is different from the set delay amount is output.

In the case where the setting of the delay amount is changed, with respect to whether a signal of a timing that is different from the set delay amount is output or not, the relationships between the delay amount before the setting change, and that after the setting change is important. FIG. 8 is a diagram showing a state where, in the case where the setting of the delay time is changed from 8 to 7, a signal of a timing that is different from the set delay amount is output.

When the delay amount is changed from 8 to 7 at time t2 in FIG. 8, data remaining in the delay elements of the delay amount of 4, those remaining in the delay elements of the delay amount of 2, and those remaining in the delay elements of the delay amount of 1 are sequentially output. These data are not data which correspond to the delay amount of 7. Therefore, a signal of a timing that is different from the set delay amount is output.

From the relationship between the delay amount before the setting change, and that after the setting change, it is possible to previously know the situation where data remaining in the delay elements are output. When this relationship is tabulated and stored, it is possible to determine whether a signal of a timing that is different from the set delay amount is output or not.

Embodiment 3

In Embodiment 3 of the invention, a variable delay apparatus in which a part of parallelized variable delay blocks is shared to reduce the circuit scale will be described.

Figure 9:
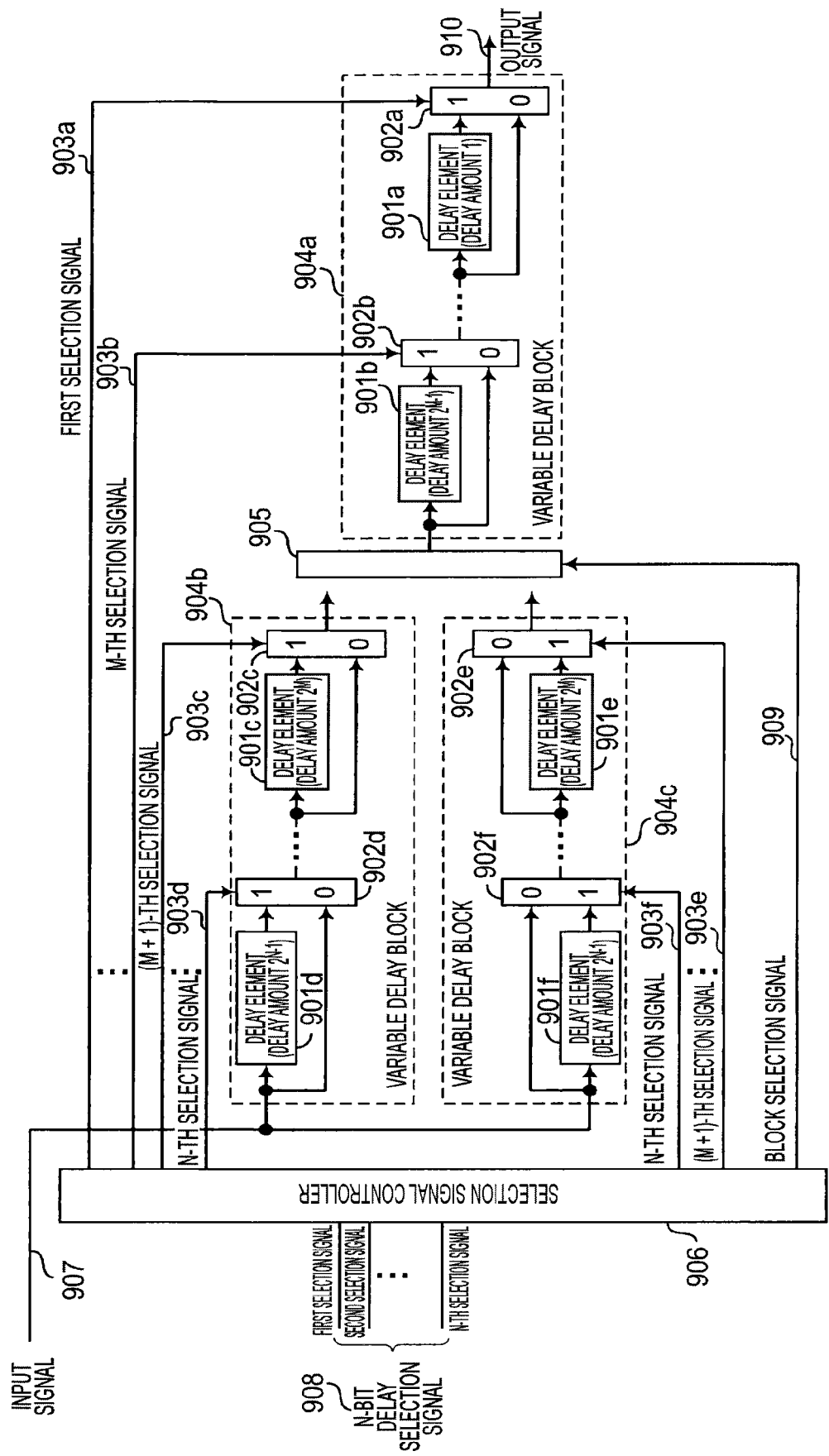
FIG. 9 is a block diagram of a variable delay apparatus of Embodiment 3 of the invention.
Figure 10:
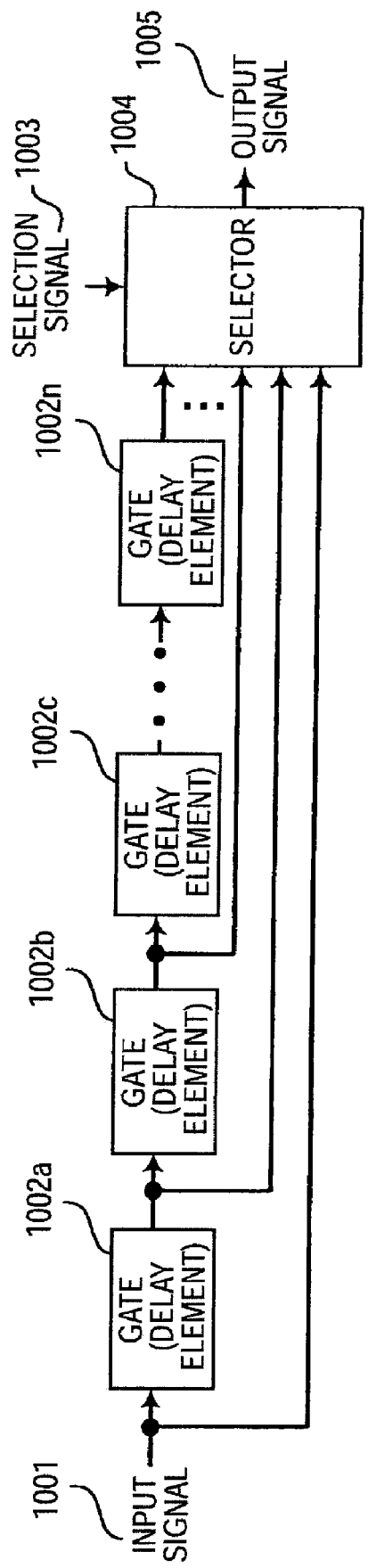
FIG. 10 is a diagram showing the configuration of a general variable delay apparatus disclosed in Patent Reference 1.

FIG. 9 is a block diagram of the variable delay apparatus of Embodiment 3 of the invention. In the variable delay apparatus of the embodiment, a part of the variable delay blocks 108, 109 in the variable delay apparatuses of the first and second embodiments is shared, whereby the circuit scale is reduced.

The variable delay apparatus shown in FIG. 9 is a variable delay apparatus which outputs an input signal while delaying the signal by a delay amount corresponding to a delay selection signal. The apparatus includes: variable delay blocks 904b, 904c which delay the input signal 907 correspondingly with an N-bit delay selection signal; a selector 905 which switches and outputs output signals of the variable delay blocks 904b, 904c correspondingly with a block selection signal 909 produced in correspondence with the first and second delay amounts that are set respectively for the variable delay blocks 904b, 904c; and a variable delay block 904a which delays an output signal of the selector 905 correspondingly with first to M-th selection signals.

Referring to FIG. 9, a selection signal controller 906 receives a supply of an N-bit delay selection signal 908 that is a signal for selecting the delay amount corresponding to the input signal 907, and performs a control for outputting a selection signal to be set in one or both of the variable delay blocks 904b, 904c and the variable delay block 904a. Furthermore, the selection signal controller 906 supplies a block selection signal 909 to the selector 905 to control the selector so as to output one of the signals from the variable delay blocks 904b, 904c, as the output signal.

The signal output from the selector 905 is further passed through the variable delay block 904a to be output as an output signal 910. In the variable delay apparatus of the embodiment, delay elements and selectors which are lower-level components of the variable delay blocks 108, 109 in the variable delay apparatus of the first embodiment shown in FIG. 1 are shared to be formed as the variable delay block 904a, and the selector 107 is placed in a middle stage to be formed as the selector 905, thereby further reducing the circuit scale.

According to the configuration, in a use method in which the delay selection signal is changed only by a step of ±1, for example, a signal of a timing that is different from a set delay amount is not output even in a configuration where delay elements of the delay amount of 1 are connected subsequent to the selector 905, and the circuit scale can be further reduced as compared with FIG. 3.

The use method in which the delay selection signal is changed only by a step of ±1 means the case where the N-bit delay selection signal 908 is changed in, for example, the delay amount of 3 to the delay amount of 4, or the delay amount of 4 to the delay amount of 3, and the configuration where delay elements of the delay amount of 1 are connected subsequent to the selector 905 means the case where the variable delay block 904a is set to the delay amount of 1.

In this case, a signal of a timing that is different from a set delay amount is not output because of the following reason. When attention is focused on the variable delay block 904a, there is only one delay element (delay element 901a) of the delay amount of 1, and, in the case where delayed/not-delayed are switched over by a selector 902a, there are only two kinds of delay amounts of 0 and 1, so that other kinds of delay amounts are not produced.

In the embodiment, a part of the duplicated (parallelized) portion in the variable delay apparatus (FIG. 1) of the first embodiment is combined into one, whereby the circuit scale is reduced when the whole variable delay apparatus is seen.

In the configuration (FIG. 1) of the first embodiment, when N=3, for example, six delay elements and seven selectors are required. In the configuration (FIG. 9) of the present embodiment, when two delay elements are disposed in each of the variable delay blocks 904b, 904c, and one delay element is disposed in the variable delay block 904a, the configuration is enabled by five delay elements and six selectors, so that the circuit scale can be reduced.

Moreover, in the configuration (FIG. 9) of the embodiment, when one delay element is disposed in each of the variable delay blocks 904b, 904c, and two delay elements are disposed in the variable delay block 904a, the configuration is enabled by four delay elements and five selectors, so that the circuit scale can be further reduced.

In the above description, the configuration where the outputs of the variable delay blocks 904b, 904c are input into the variable delay block 904a to be subjected to the delaying process has been described. Alternatively, the variable delay block 904a may be further parallelized, so that a delay due to reflection of the delay amount setting does not occur in the same manner as the case where the variable delay blocks 904b, c are parallelized. In the case where variable delay apparatus outputs plural different delay signals, the first delay signal may be set as the output of the variable delay block 904b or 904c, and the second delay signal may be set as the output of the variable delay block 904a.

As described above, the variable delay apparatus of the invention is a variable delay apparatus which delays an input signal by a delay amount corresponding to a delay selection signal, and which outputs the delayed signal, and includes: a first variable delay block which delays the input signal by a first delay amount that is set by the delay selection signal, and which outputs the delayed signal; a second variable delay block which delays the input signal by a second delay amount that is set by the delay selection signal, and which outputs the delayed signal; and a first selector which switches and outputs output signals of the first and second variable delay blocks correspondingly with an output selection signal that is produced in correspondence with the first and second delay amounts.

According to the configuration, the output signals of the first and second variable delay blocks are switched to be output correspondingly with the output selection signal that is produced in correspondence with the first and second delay amounts. Even immediately after the delay amount of the variable delay apparatus is changed, therefore, it is possible to avoid a situation where a signal of a timing that is different from the set delay amount is output.

In the variable delay apparatus of the invention, the first and second variable delay blocks have N sets (N is a natural number) of a delay element and second selector which selects one of a signal input into the delay element and a signal output from the delay element in accordance with the delay selection signal, and outputs the selected signal.

In the variable delay apparatus of the invention, the output selection signal is produced correspondingly with a magnitude relationship between the first and second delay amounts.

According to the configuration, the output selection signal is produced correspondingly with a magnitude relationship between the first and second delay amounts, and hence the first selector can be switched so that a signal of a timing that is different from the set delay amount is not output.

In the variable delay apparatus of the invention, in the case where the first delay amount is changed, when a signal of a delay amount which is different from the set value is output from the first variable delay block, the output selection signal switches the first selector so as to select the output signal of the second variable delay block.

According to the configuration, it is possible to provide a variable delay apparatus in which, in the case where the first delay amount is changed, when a signal of a delay amount which is different from the set value is output from the first variable delay block, the output signal of the second variable delay block is selected, thereby preventing a signal of a timing that is different from a set delay amount, from being output.

In the variable delay apparatus of the invention, after elapse of a time when a signal of a delay amount which is different from the set value is output from the second variable delay block, the output selection signal switches the first selector.

The variable delay apparatus of the invention includes a timing table which stores correspondence relationships between the first and second delay amounts and the output selection signal.

The variable delay apparatus of the invention includes a selection signal controller which receives a supply of the delay selection signal, which outputs a first delay selection signal to the first variable delay block, which outputs a second delay selection signal to the second variable delay block, and which outputs the output selection signal to the first selector.

In the variable delay apparatus of the invention, in the case where the first delay amount is changed, when a signal of a delay amount which is different from the set value is not output from the first variable delay block, the selection signal controller changes the first delay amount.

According to the configuration, when, even in the case where the first delay amount is changed, a signal of a delay amount which is different from the set value is not output, the first delay amount is changed, whereby jitter in the signal output from the variable delay apparatus can be reduced.

In the variable delay apparatus of the invention, in the case where the first delay amount is changed, when a signal of a delay amount which is different from the set value is output from the first variable delay block, the selection signal controller changes the second delay amount.

In the variable delay apparatus of the invention, after elapse of a time when a signal of a delay amount which is different from the set value is output from the second variable delay block, the selection signal controller switches the first selector.

Moreover, the variable delay apparatus of the invention is a variable delay apparatus which delays an input signal by a delay amount corresponding to a delay selection signal, and which outputs the delayed signal, and includes: first and second variable delay blocks which delay the input signal correspondingly with the delay selection signal, and which output the delayed signal; first selector which switches and outputs output signals of the first and second variable delay blocks correspondingly with a block selection signal that is produced in correspondence with first and second delay amounts which are set respectively for the first and second variable delay blocks; and a third variable delay block which delays an output signal of the first selector correspondingly with the delay selection signal.

According to the configuration, the first selector can be switched so that a signal of a delay amount that is different from the set value is not output. Furthermore, as compared with the configuration where the first variable delay block outputs the input signal while delaying the signal by the first delay amount, the second variable delay block outputs the input signal while delaying the signal by the second delay amount, and one of the outputs is selected by the selector, a part of the duplicated (parallelized) variable delay blocks is combined into one, and hence the circuit scale of the whole variable delay apparatus can be reduced.

In the variable delay apparatus of the invention, the first and second variable delay blocks have (N−M) sets (N and M are natural numbers, and N>M) of a delay element and second selector for selecting and outputting one of a signal input into the delay element and a signal output from the delay element, in accordance with the delay selection signal, and the third variable delay block has M sets of a delay element and second selector for selecting and outputting one of a signal input into the delay element and a signal output from the delay element, in accordance with the delay selection signal.

In the variable delay apparatus of the invention, includes a selection signal controller which receives a supply of the delay selection signal, which outputs a first delay selection signal to the first variable delay block, which outputs a second delay selection signal to the second variable delay block, which outputs a third delay selection signal to the third variable delay block, and which outputs the block selection signal to the first selector.

Although the invention has been described in detail and with reference to the specific embodiments, it is obvious to those skilled in the art that various changes and modifications can be made without departing from the spirit and scope of the invention.

This application is based on Japanese Patent Application (No. 2006-217909) filed on Aug. 10, 2006 and Japanese Patent Application (No. 2007-163978) filed on Jun. 21, 2007, the contents of which are incorporated herein by reference.

INDUSTRIAL APPLICABILITY

The variable delay block of the invention has an effect that a variable delay block in which, even immediately after the delay amount of the variable delay apparatus is changed, a signal of a timing that is different from a set delay amount is not output can be provided, and is useful as a variable delay block or the like which is used for adjusting the timing of an input signal and outputting the signal by making the delay time variable.

The invention claimed is:

1. A variable delay apparatus for delaying an input signal by a delay amount corresponding to a delay selection signal, and outputting a selected delayed signal, the apparatus comprising:
  first to I-th variable delay blocks (I is a natural number) which delay the input signal by first to I-th delay amounts that are respectively set by the delay selection signal, the first to I-th variable delay blocks output respective delayed signals; and
  a first selector which selects one of the respective delayed signals of the first to I-th variable delay blocks correspondingly with an output selection signal that is produced in correspondence with the first to I-th delay amounts, and outputs the selected delayed signal,
  wherein the output selection signal is produced so that, in a case where a first delay amount is changed, when a first delayed signal outputted by a first variable delay block has a delay amount which is different from a set value for the first variable delay block, the first selector selects one of the respective delayed signals of the second to I-th variable delay blocks.

2. The variable delay apparatus according to claim 1, wherein:
each of the first to I-th variable delay blocks has: N sets (N is a natural number) of a delay element and a second selector which selects one of a signal input into the delay element or a signal output from the delay element in accordance with the delay selection signal, and outputs the one of the signal input into the delay element or the signal output from the delay element as selected.

3. The variable delay apparatus according to claim 1, wherein:
the output selection signal is produced correspondingly with set states of the delay amounts of the first to I-th variable delay blocks.

4. The variable delay apparatus according to claim 3, wherein:
the output selection signal is produced correspondingly with magnitude relationships between the first to I-th delay amounts which are set respectively in the first to I-th variable delay blocks.

5. The variable delay apparatus according to claim 3, wherein:
the output selection signal is produced in synchronization with the input signal.

6. The variable delay apparatus according to claim 1, wherein:
after elapse of a predetermined time in which a second delayed signal outputted by a second variable delay block has a delay amount which is different from a set value for the second variable delay block, the output selection signal is produced so that the first selector selects the first delayed signal of the first variable delay block.

7. The variable delay apparatus according to claim 6, wherein:
after elapse of the predetermined time which is set correspondingly with the delay amounts that are set respectively in the second to I-th variable delay blocks, the output selection signal is produced so that the first selector selects the first delayed signal of the first variable delay block.

8. A variable delay apparatus for delaying an input signal by a delay amount corresponding to a delay selection signal, and outputting a selected delayed signal, the apparatus comprising:
first to I-th variable delay blocks (I is a natural number) which delay the input signal by first to I-th delay amounts that are respectively set by the delay selection signal, the first to I-th variable delay blocks output respective delayed signals;
a first selector which selects one of the respective delayed signals of the first to I-th variable delay blocks correspondingly with an output selection signal that is produced in correspondence with the first to I-th delay amounts, and outputs the selected delayed signal, wherein the output selection signal is produced correspondingly with set states of the delay amounts of the first to I-th variable delay blocks; and
a timing table which stores correspondence relationships between the first to I-th delay amounts and the output selection signal.

9. A variable delay apparatus for delaying an input signal by a delay amount corresponding to a delay selection signal, and outputting a selected delayed signal, the apparatus comprising:
first to I-th variable delay blocks (I is a natural number) which delay the input signal by first to I-th delay amounts that are respectively set by the delay selection signal, the first to I-th variable delay blocks output respective delayed signals;
a first selector which selects one of the respective delayed signals of the first to I-th variable delay blocks correspondingly with an output selection signal that is produced in correspondence with the first to I-th delay amounts, and outputs the selected delayed signal, wherein the output selection signal is produced correspondingly with set states of the delay amounts of the first to I-th variable delay blocks; and
a selection signal controller which receives a supply of the delay selection signal, outputs an i-th (i is one of natural numbers from 1 to I) delay selection signal to the i-th variable delay block, and outputs the output selection signal to the first selector.

10. The variable delay apparatus according to claim 9, wherein:
in a case where a first delay amount is changed, when a first delayed signal outputted by the first variable delay block has a delay amount which is not different from a set value for the first variable delay block, the selection signal controller changes the first delay amount.

11. The variable delay apparatus according to claim 9, wherein:
in a case where a first delay amount is changed, when a first delayed signal outputted by the first variable delay block has a delay amount which is different from a set value for the first variable delay block, the selection signal controller changes one of the second to I-th delay amounts.

12. The variable delay apparatus according to claim 11, wherein:
after elapse of a predetermined time in which a second delayed signal outputted by one of the second to I-th variable delay blocks has a delay amount which is different from a set value for the one of the second to I-th variable delay blocks in which the delay amount is changed, the selection signal controller switches the first selector.

13. The variable delay apparatus according to claim 9, comprising:
an adjusting function of, in a case where a first delay amount is changed, when a difference between a set value of the first variable delay block and a first delay signal outputted by the first variable delay block is within a predetermined error range, performing a control so that the first delay signal outputted by the first variable delay block coincides with the set value.

14. The variable delay apparatus according to claim 13, comprising:
a power supply controller which changes a power supply to be supplied to the first variable delay block, thereby realizing the adjusting function.

15. A variable delay apparatus for delaying an input signal by a delay amount corresponding to a delay selection signal, and outputting a selected delayed signal, the apparatus comprising:
first to I-th variable delay blocks (I is a natural number) which delay the input signal by first to I-th delay amounts that are respectively set by the delay selection signal, the first to I-th variable delay blocks output respective delayed signals;

a first selector which selects one of the respective delayed signals of the first to I-th variable delay blocks correspondingly with an output selection signal that is produced in correspondence with the first to I-th delay amounts, and outputs the selected delayed signal, wherein the output selection signal is produced correspondingly with set states of the delay amounts of the first to I-th variable delay blocks, the output selection signal is produced so that, in a case where a first delay amount is changed, when a first delayed signal outputted by a first variable delay block has a delay amount which is different from a set value for the first variable delay block, the first selector selects one of the respective delayed signals of the second to I-th variable delay blocks; and a detecting function of detecting that the first delayed signal outputted by the first variable delay block is different from the set value.

16. The variable delay apparatus according to claim 15, comprising:

a phase comparator which compares the first delayed signal outputted by the first variable delay block with the set value, thereby realizing the detecting function.

* * * * *